(12) United States Patent
Yang et al.

(10) Patent No.: US 10,761,151 B2
(45) Date of Patent: Sep. 1, 2020

(54) OPTICAL PROBE SYSTEM AND METHOD

(71) Applicant: Advanced Fiber Sensors, Inc., Ann Arbor, MI (US)

(72) Inventors: Kyoung Yang, Ann Arbor, MI (US); John Whitaker, Dexter, MI (US)

(73) Assignee: Advanced Fiber Sensors, Inc., Ann Arbor, MI (US)

( * ) Notice: Subject to any disclaimer, the term of this patent is extended or adjusted under 35 U.S.C. 154(b) by 30 days.

(21) Appl. No.: 15/753,847

(22) PCT Filed: Aug. 19, 2016

(86) PCT No.: PCT/US2016/047703
§ 371 (c)(1),
(2) Date: Feb. 20, 2018

(87) PCT Pub. No.: WO2017/034948
PCT Pub. Date: Mar. 2, 2017

(65) Prior Publication Data
US 2019/0011507 A1    Jan. 10, 2019

Related U.S. Application Data

(60) Provisional application No. 62/210,012, filed on Aug. 26, 2015.

(51) Int. Cl.
*G01R 33/032* (2006.01)
*G02F 1/29* (2006.01)
(Continued)

(52) U.S. Cl.
CPC ........ *G01R 33/032* (2013.01); *B01F 13/0818* (2013.01); *B01F 15/065* (2013.01); *B01L 7/00* (2013.01); *B01L 9/00* (2013.01); *G02B 6/10* (2013.01); *G02B 6/27* (2013.01); *G02B 7/18* (2013.01); *G02B 23/2423* (2013.01);
(Continued)

(58) Field of Classification Search
None
See application file for complete search history.

(56) References Cited

U.S. PATENT DOCUMENTS 6,122,414 A    9/2000  Blake
6,835,926 B2  12/2004  Weitekamp et al.
(Continued)

OTHER PUBLICATIONS

International Search Report dated Nov. 28, 2016.

*Primary Examiner* — Douglas X Rodriguez
(74) *Attorney, Agent, or Firm* — Darrow Mustafa PC

(57) ABSTRACT

An optical fiber-mounted field sensor for measuring an electric or magnetic field includes an optical fiber configured to receive light from a laser source, a polarizer, a polarization manipulator, electro-optical material or magneto-optical material adjacent to the polarization manipulator, and a high reflection coating. The polarizer is adjacent to an output of the fiber, while the polarization manipulator is adjacent to the polarizer and opposite of the optical fiber. The electro-optical material or magneto-optical material is adjacent to the polarization manipulator, and the high reflection coating is adjacent to the electro-optical material or magneto-optical material. An optical mainframe for sending and receiving optical beams to and from the optical fiber-mounted field sensor is also described.

10 Claims, 15 Drawing Sheets

(51) Int. Cl.
*G02B 6/10* (2006.01)
*G02B 7/18* (2006.01)
*G02B 6/27* (2006.01)
*B01F 13/08* (2006.01)
*B01F 15/06* (2006.01)
*B01L 7/00* (2006.01)
*B01L 9/00* (2006.01)
*G02B 23/24* (2006.01)
*G02B 6/26* (2006.01)

(52) U.S. Cl.
CPC .......... *G02F 1/29* (2013.01); *B01F 2015/062* (2013.01); *B01F 2215/0037* (2013.01); *B01L 2300/06* (2013.01); *B01L 2300/0609* (2013.01); *B01L 2300/0627* (2013.01); *B01L 2300/0832* (2013.01); *B01L 2300/12* (2013.01); *B01L 2300/18* (2013.01); *G02B 6/262* (2013.01); *G02B 6/2766* (2013.01)

(56) References Cited

U.S. PATENT DOCUMENTS

| | | | |
|---|---|---|---|
| 2009/0208170 A1 | 8/2009 | Moriarty | |
| 2014/0070802 A1* | 3/2014 | Yamada | G01R 33/032 324/244.1 |
| 2015/0023629 A1* | 1/2015 | Davis | G02B 6/322 385/11 |

\* cited by examiner

OPTICAL PROBE SYSTEM AND METHOD

CROSS REFERENCE TO RELATED APPLICATIONS

This application is a National Stage Entry that claims the benefit of PCT/US2016/047703 that claims priority to U.S. Provisional Patent Application No. 62/210,012 filed on Aug. 26, 2015, which is hereby incorporated by reference in its entirety.

BACKGROUND

1. Field of the Invention

The present invention relates to fiber based electro-optic and magneto-optic sensing systems with a probe tip for measuring electric or magnetic fields.

2. Description of Related Art

Electro-optic and magneto-optic field mapping have been recognized as diagnostic measurement techniques for the microwave, millimeter-wave, and sub-millimeter-wave regimes. Due to the single micrometer spatial resolution, broad bandwidth, and low invasiveness, electro-optic and magneto-optic field mapping have been used for fault isolation of microwave integrated circuits, extreme near-field mapping and near-to-far field transition characterization of antenna elements, performance verification of active quasi-optical power-combining arrays, and performance testing of active and passive antennas.

BRIEF DESCRIPTION OF THE DRAWINGS

FIG. 4A illustrates the relative signal from the optical fiber-mounted field sensor of FIGS. 1A-1N and 2A-2N, while

DETAILED DESCRIPTION

Figure 1A:
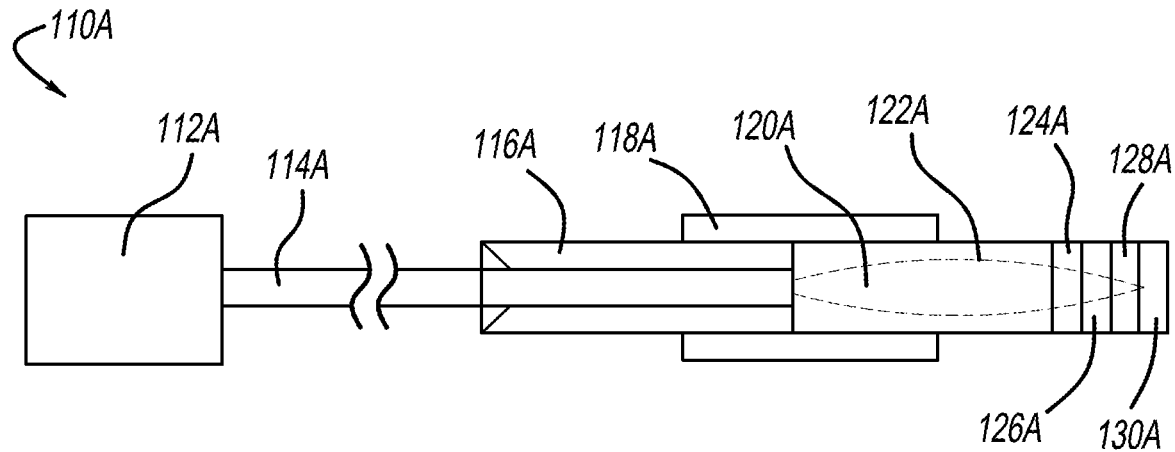
FIGS. 1A-1N illustrate optical fiber-mounted electric field sensors.

FIG. 1A illustrates an optical fiber-mounted electric field sensor 110A utilizing a single optical fiber to guide a light beam both to and from the end of the sensor. An optical fiber-mounted electric field sensor as described in FIGS. 1A-1N can be utilized to measure an electric field at a location on a circuit board, in free space, or elsewhere. The optical fiber-mounted electric field sensor as described in FIGS. 1A-1N has the distinct advantage of allowing for nonintrusive, interference-free, reliable measurements with minimized noise.

Here, the sensor 110A has an optical connector 112A for connecting to an optical source, such as a laser or an optical mainframe, as will be described in FIGS. 3A-3H. Connected to the optical connector 112A, is a fiber 114A. The fiber 114A may be polarization-maintaining fiber. The fiber 114A is fed into a fiber guiding ferrule 116A which functions to properly guide the fiber 114A to the center of the face of a lens 120A.

The sensor 110A also includes an alignment sleeve 118A for positioning the circular circumferential edge of the face of the ferrule 116A so that it is aligned with the circular circumferential edge of a face of the lens 120A. The lens 120A may be a focusing lens, such as a graded-index (GRIN) lens. When connected as shown in FIG. 1A, an optical beam provided to the fiber 114A is provided to the lens 120A and is generally profiled by the dotted line 122A.

The optical beam 122A from the lens 120A is then provided to a polarizer 124A which functions to polarize the optical beam 122A. Connected to the polarizer 124A is a polarization manipulator 126A. The polarization manipulator 126A may be a wave plate or an optical rotator, and in either case, it functions to rotate the polarization of the optical beam 122A.

Electro-optical material 128A may be applied to the polarization manipulator 126A. The electro-optical material 128A may be made of any medium exhibiting the Pockels effect, such as gallium arsenide (GaAs), aluminum-gallium-arsenide (AlGaAs), indium phosphide (InP), cadmium telluride (CdTe), zinc selenide (ZnSe), zinc telluride (ZnTe), bismuth silicate ($Bi_{12}SiO_{20}$), cadmium sulfide (CdS), cadmium selenide (CdSe), lithium tantalate ($LiTaO_3$), lithium niobate ($LiNbO_3$), composites thereof, and mixtures thereof. At the tip of the sensor 110A, a high reflection coating 130A may be applied. The high reflection coating 130A may comprise of alternating dielectric layers such as ZnSe, MgF2, SiO2, SiO, Si3N4, or other various dielectric materials.

Figure 1B:
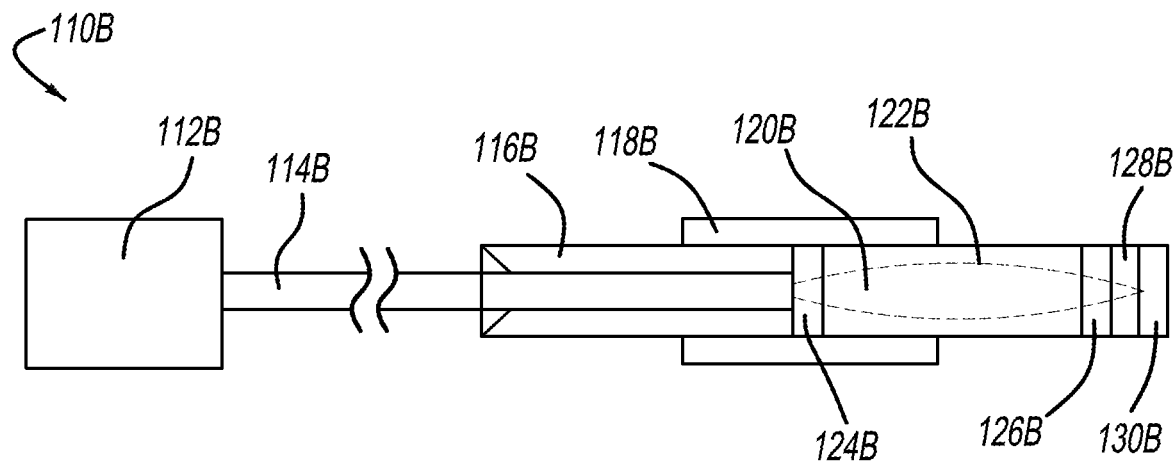
Figure 1C:
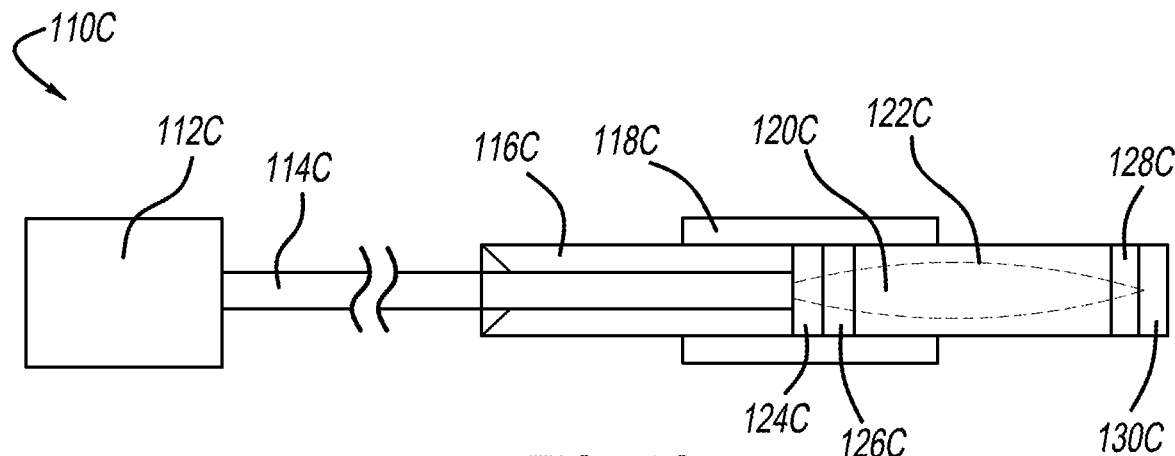

Referring to FIGS. 1B and 1C, the sensors 110B and 110C are similar to those described in FIG. 1A. As such, like reference numerals have been utilized to refer to like elements. However, the sensor 110B of FIG. 1B has relocated the polarizer 124B to be located between the lens 120B and the ferrule 116B. In FIG. 1C, the polarizer 124C and the polarization manipulator 126C are both located between the ferrule 116C and the lens 120C.

Figure 1D:
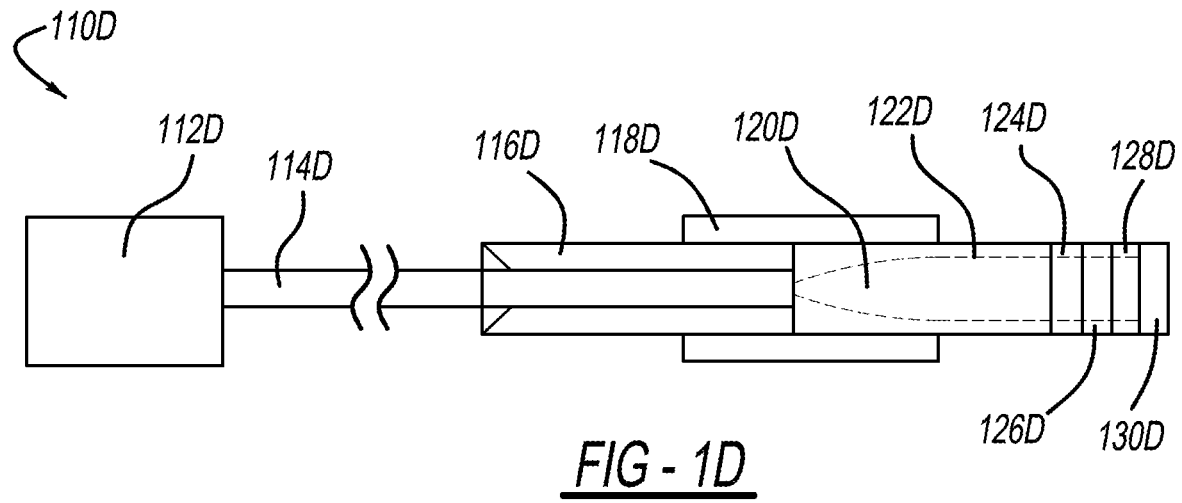
Figure 1E:
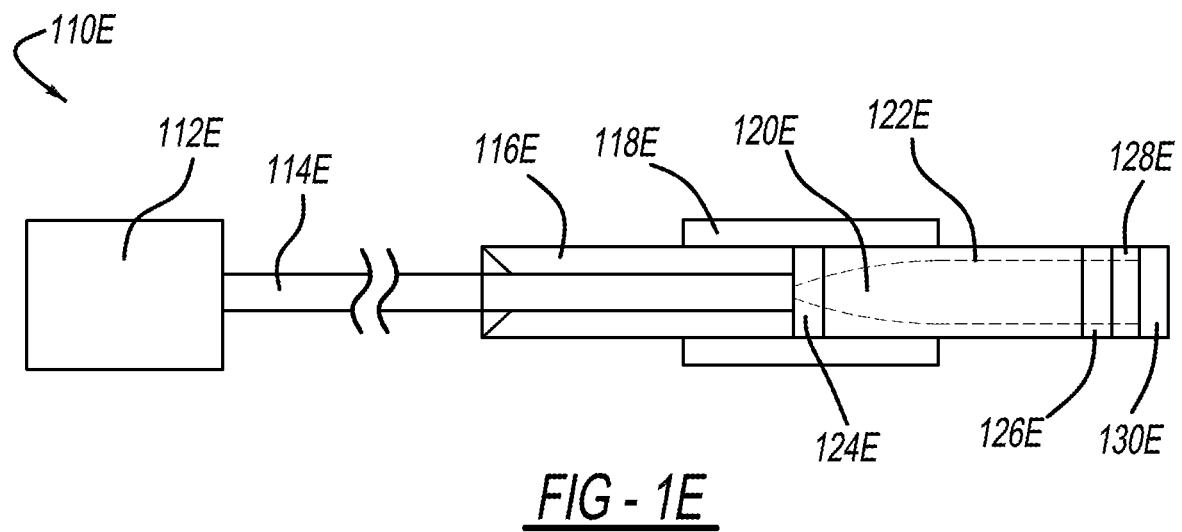
Figure 1F:
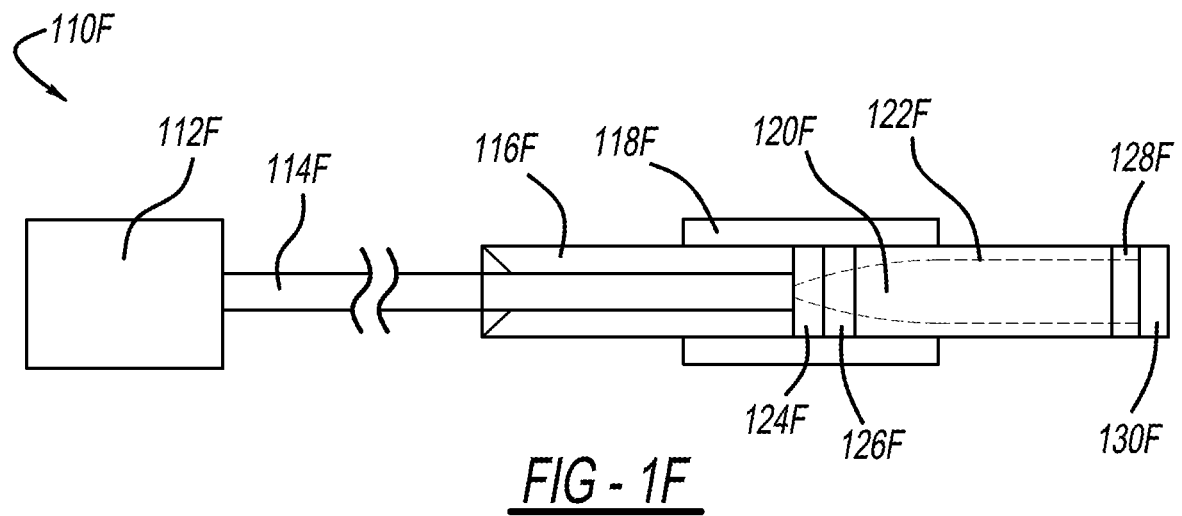

Referring to FIGS. 1D, 1E, and 1F, these figures are similar to FIGS. 1A, 1B, and 1C, respectively. However, the FIGS. 1D, 1E, and 1F have replaced the focusing lens 120A, 120B, 120C, with a collimating lens, 120D, 120E, and 120F. As a result, the optical beam profiles in the lenses 120D, 120E, and 120F result not in a focusing profile but rather a collimating profile as shown in the dotted lines 122D, 122E, and 122F.

Figure 1G:
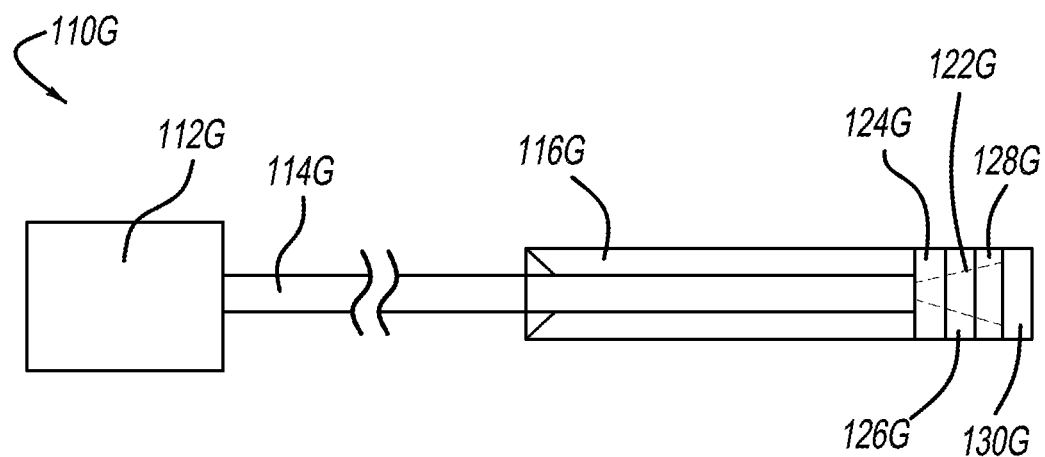
Figure 1H:
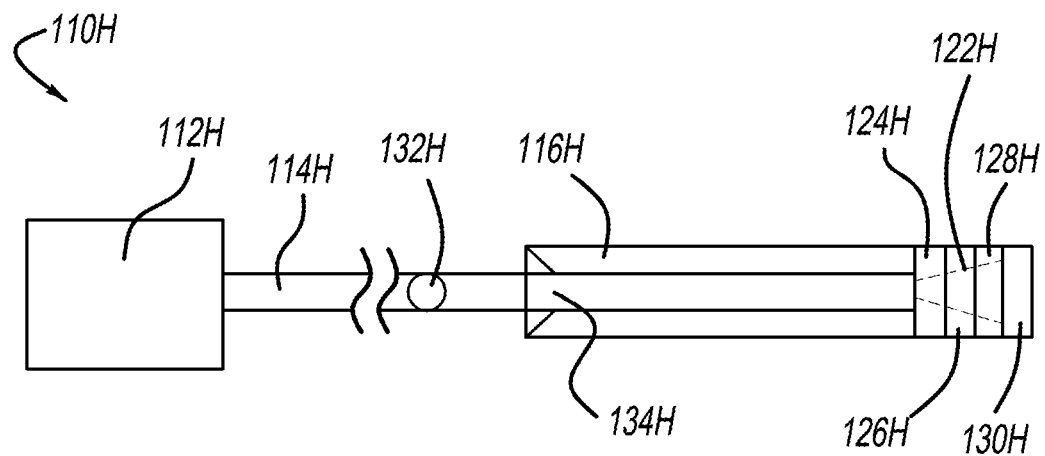

Referring to FIG. 1G, the sensor 110G is similar to the sensor described in FIG. 1A, however, in this embodiment, the sensor 110G has removed the lens 120A of FIG. 1A and the alignment sleeve 118A of FIG. 1A. As such, the optical beam profile 122G varies so that it is diverging, as it is no longer focused or collimated by a separate lens. Referring to FIG. 1H, the sensor 110H is similar to the sensor 110G, but in this case, there is a fiber splicing point 132H. The fiber splicing point 132H is connected to the polarization-maintaining fiber 114H on one side and a different type of fiber 134H on the other side. The different fiber 134H may be a single mode fiber, gradient-index fiber or thermally expanded core fiber.

Figure 1I:
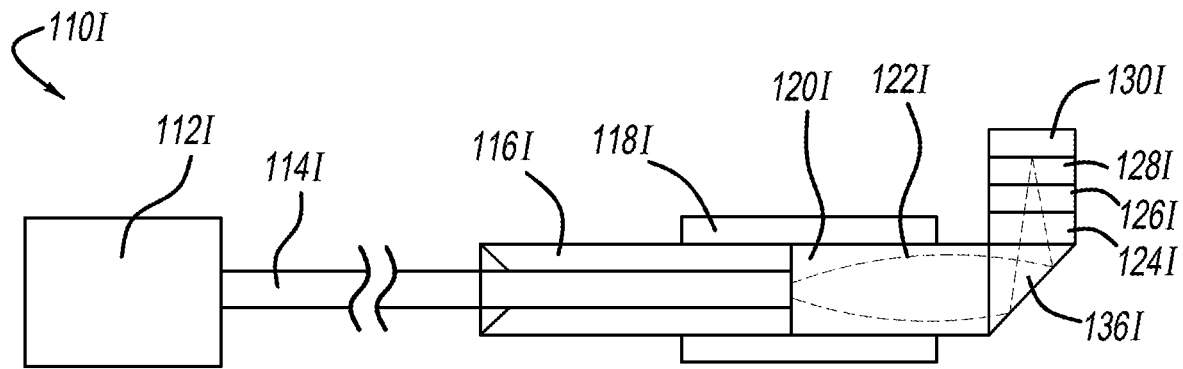
Figure 1J:
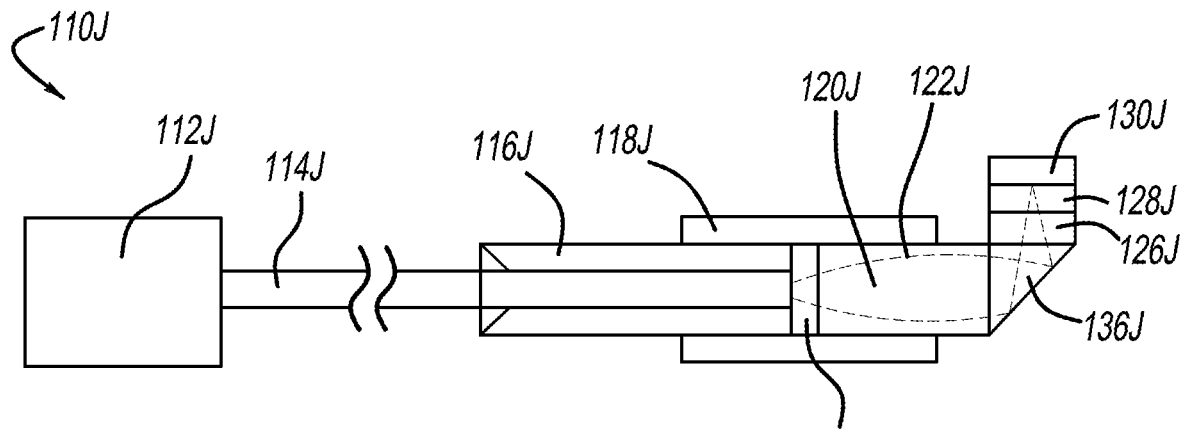
Figure 1K:
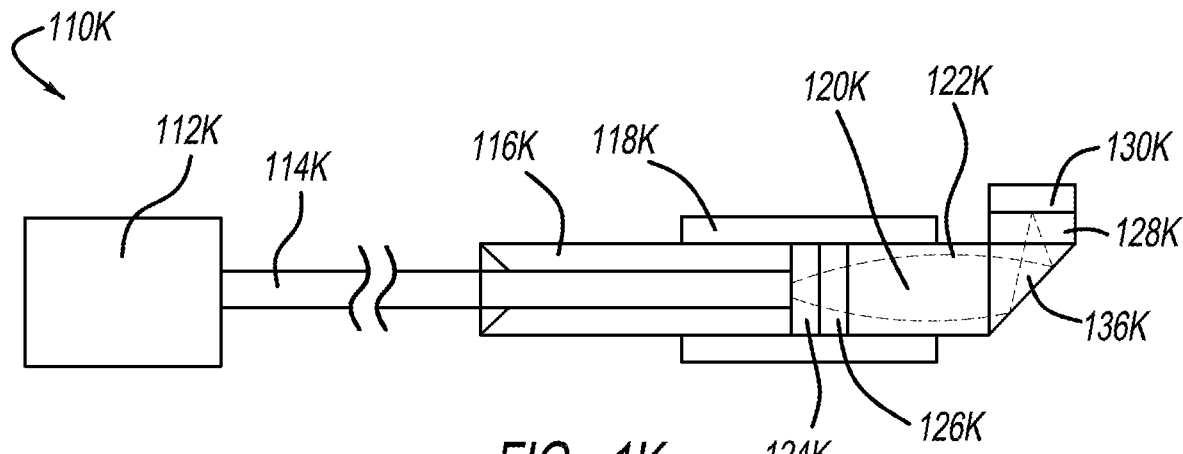

Referring to FIGS. 1I, 1J, and 1K, the sensors 110I, 110J, and 110K are similar to the sensors 110A, 110B, and 110C shown and described in FIGS. 1A, 1B, and 1C, respectively. However, the sensors 110I, 110J, and 110K each additionally disclose the use of a right angle prism 136I, 136J, and 136K being directly coupled to lens 120I, 120J, and 120K, respectively. By so doing, the right angle prisms 136I, 136J, and 136K have the advantage of allowing the tip of the sensors 110I, 110J, and 110K to be bent at a 90-degree angle, potentially allowing access to a measurement area and/or an electric field polarization vector that may be inaccessible otherwise.

Figure 1L:
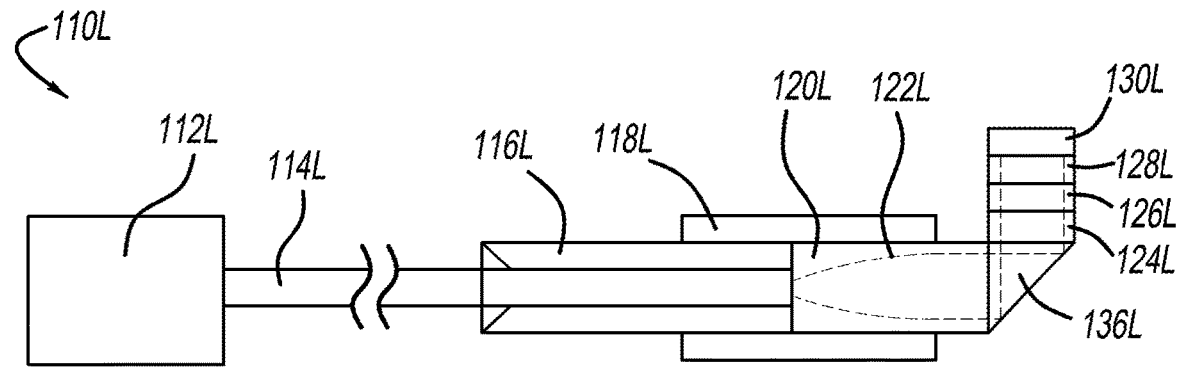
Figure 1M:
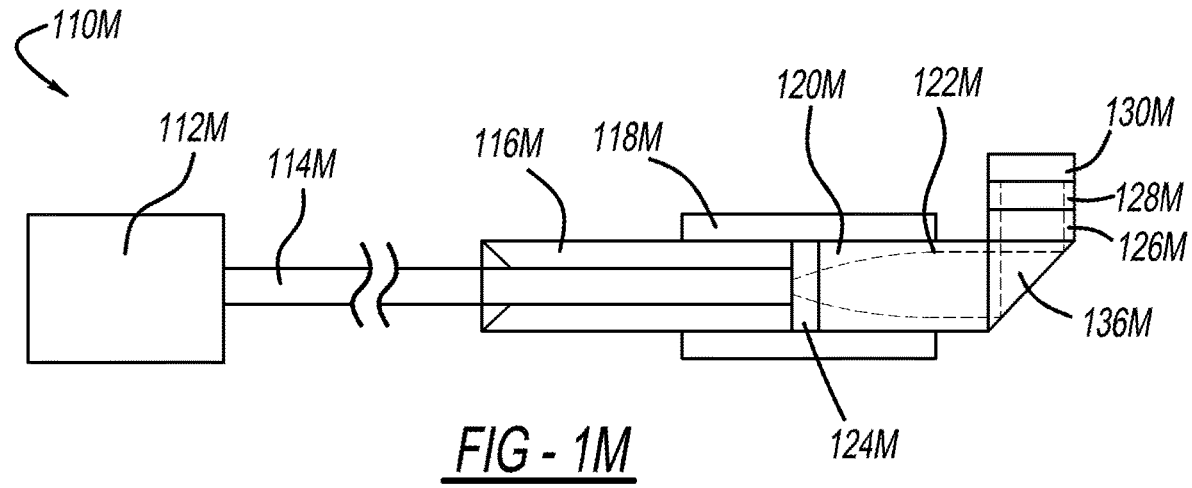
Figure 1N:
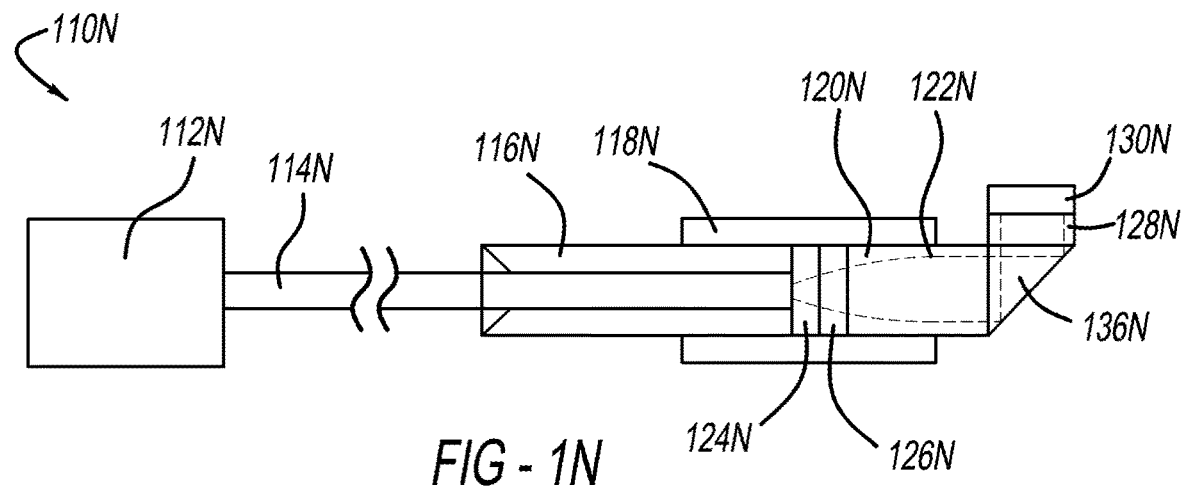

Referring to FIGS. 1L, 1M, and 1N, the sensors 110L, 110M, and 110N are similar to those shown and described in FIGS. 1I, 1J, and 1K, respectively. However, the sensors 110L, 110M, and 110N differ from those described above in that the focusing lenses 120I, 120J, and 120K, have been replaced with the collimating lenses 120L, 120M, and 120N, respectively.

Figure 2A:
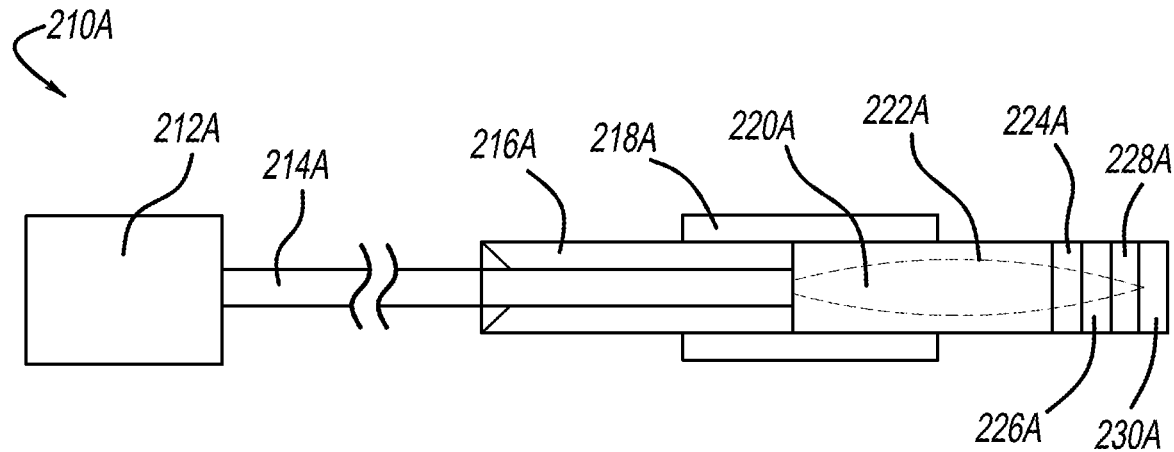
FIGS. 2A-2N illustrate optical fiber-mounted magnetic field sensors.

FIG. 2A illustrates an optical fiber-mounted magnetic field sensor 210A utilizing a single optical fiber to guide a light beam both to and from the end of the sensor. An optical fiber-mounted magnetic field sensor as described in FIGS. 2A-2N can be utilized to measure a magnetic field at a location on a circuit board, in free space, or elsewhere. The optical fiber-mounted magnetic field sensor as described in FIGS. 2A-2N has the distinct advantage of allowing for nonintrusive, interference-free, reliable measurements with minimized noise.

Here, the sensor 210A has an optical connector 212A for connecting to an optical source, such as a laser or an optical mainframe, as will be described in FIGS. 3A-3H. Connected to the optical connector 212A, is a fiber 214A. The fiber 214A may be polarization-maintaining fiber. The fiber 214A is fed into a fiber guiding ferrule 216A which functions to properly guide the fiber 214A to the center of the face of a lens 220A.

The sensor 210A also includes an alignment sleeve 218A for positioning the circular circumferential edge of the face of a ferrule 216A so that it is aligned with the circular circumferential edge of a face of a lens 220A. The lens 220A may be a focusing lens, such as a GRIN lens. When connected as shown in FIG. 2A, an optical beam provided to the fiber 214A is provided to the lens 220A and is generally profiled by the dotted line 222A.

The optical beam 222A from the lens 220A is then provided to a polarizer 224A which functions to polarize the optical beam 222A. Connected to the polarizer 224A is a polarization manipulator 226A. The polarization manipulator 226A may be a wave plate or an optical rotator, and in either case, it functions to rotate the polarization of the optical beam 222A.

Magneto-optical material 228A may be applied to the polarization manipulator 226A. The magneto-optical material 228A may be made of any medium exhibiting the Faraday effect, such as bismuth-substituted rare-earth iron garnet (commonly known as Bi:RIG), bismuth-substituted yttrium iron garnet, terbium gallium garnet, SF-29 glass, cadmium manganese telluride (CdMnTe), cadmium manganese mercury telluride (CdMnHgTe), cadmium manganese selenide (CdMnSe), fused silica, doped alumina silicate glass, silicon dioxide ($SiO_2$), composites thereof, and mixtures thereof.

Figure 2B:
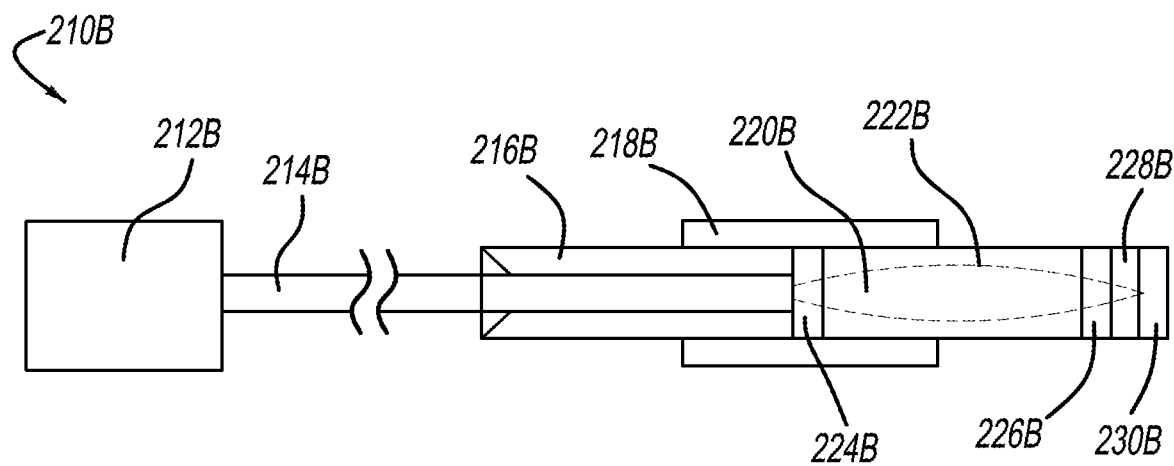
Figure 2C:
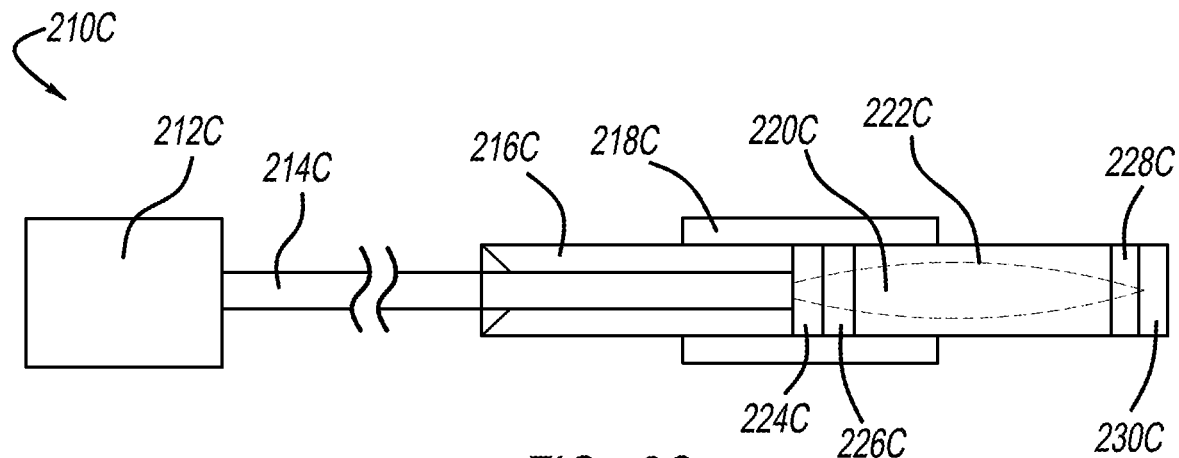

Referring to FIGS. 2B and 2C, the sensors 210B and 210C are similar to those described in FIG. 2A. As such, like reference numerals have been utilized to refer to like elements. However, the sensor 210B of FIG. 2B has relocated the polarizer 224B to be located between the lens 220B and the ferrule 216B. In FIG. 2C, the polarizer 224C and the polarization manipulator 226C are both located between the ferrule 216C and the lens 220C.

Figure 2D:
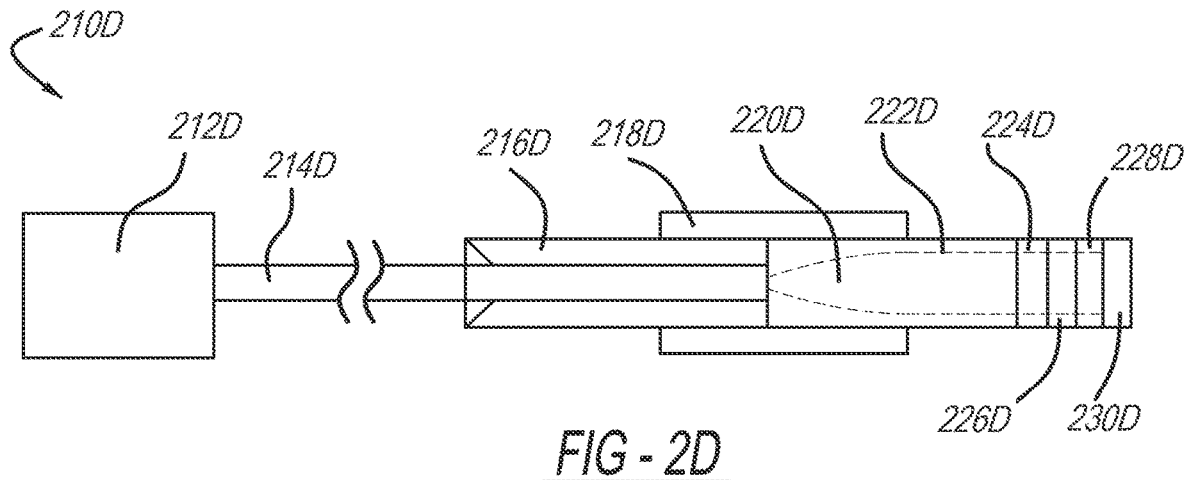
Figure 2E:
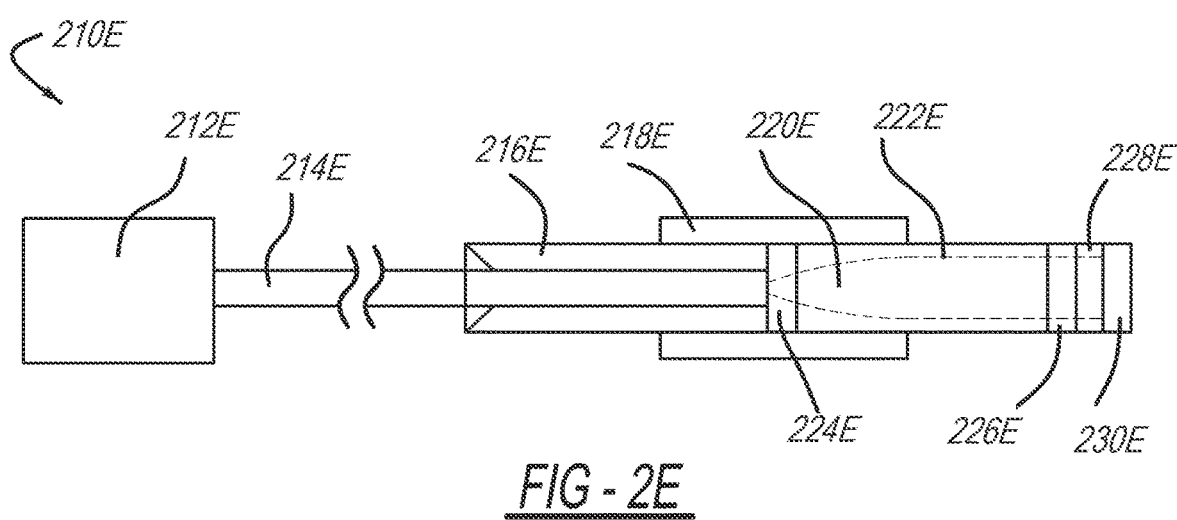
Figure 2F:
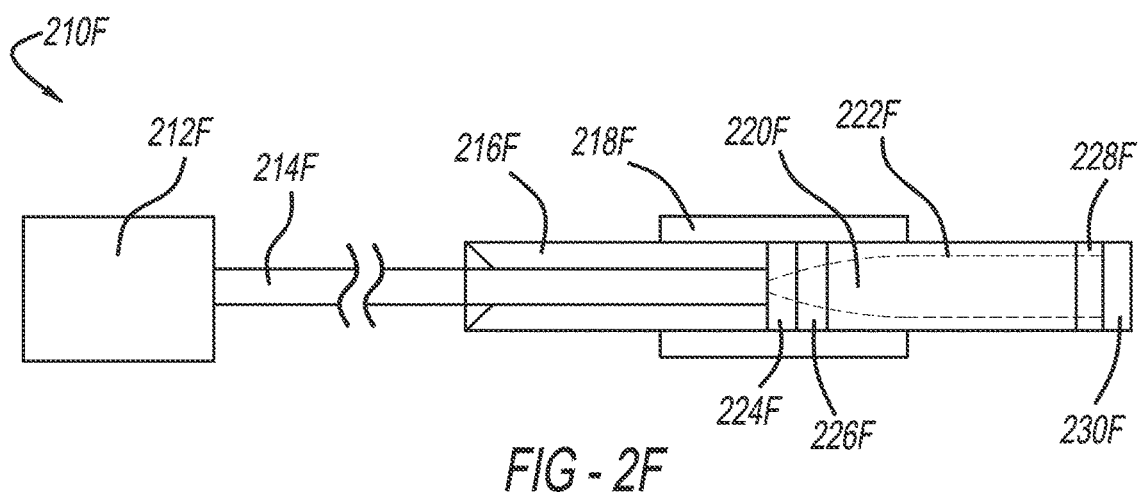

Referring to FIGS. 2D, 2E, and 2F, these figures are similar to FIGS. 2A, 2B, and 2C, respectively. However, the FIGS. 2D, 2E, and 2F have replaced the focusing lens 220A, 220B, 220C, with a collimating lens, 220D, 220E, and 220F. As a result, the optical beam profiles in the lenses 220D, 220E, and 220F result not in a focusing profile but rather a collimating profile as shown in the dotted lines 222D, 222E, and 222F.

Figure 2G:
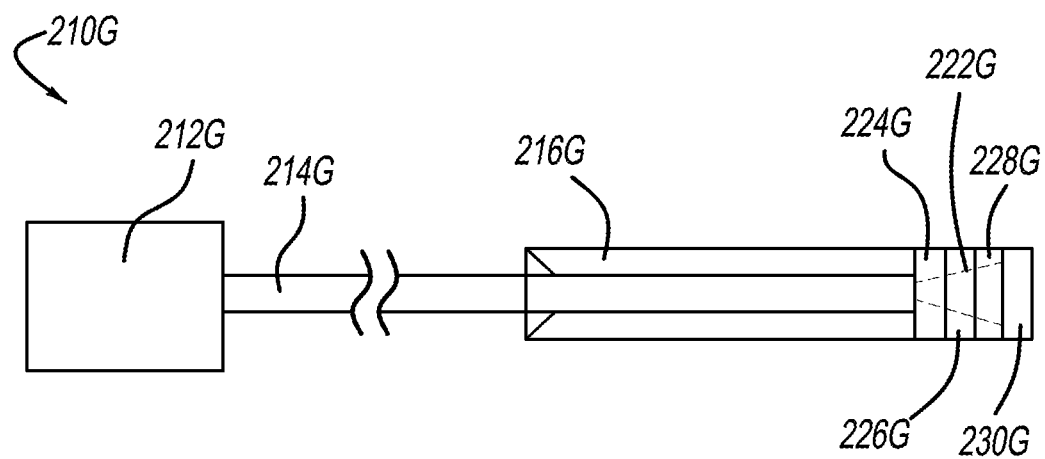
Figure 2H:
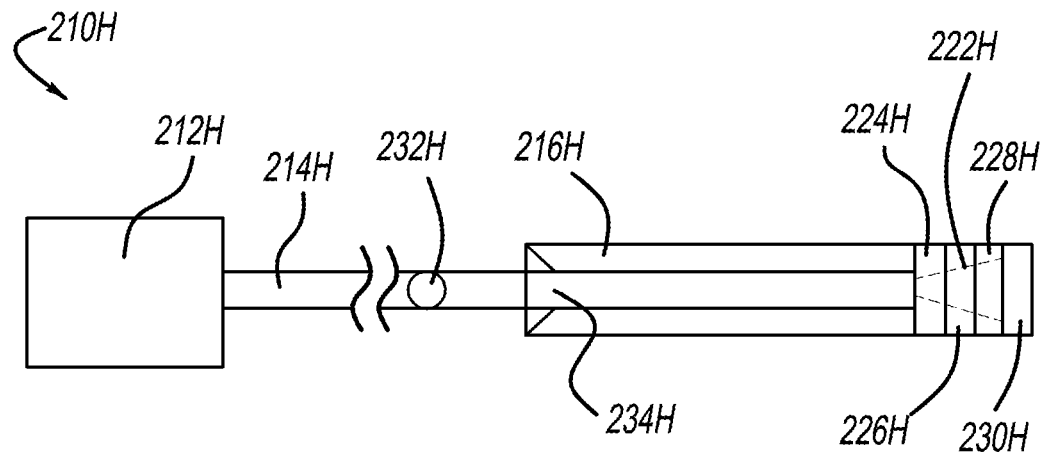

Referring to FIG. 2G, the sensor 210G is similar to the sensor described in FIG. 2A, however, in this embodiment, the sensor 210G has removed the lens 220A of FIG. 2A and the alignment sleeve 218A of FIG. 2A. As such, the optical beam profile 222G varies so that it is diverging, as it is no longer focused or collimated by a separate lens. Referring to FIG. 2H, the sensor 210H is similar to the sensor 210G, but in this case, there is a fiber splicing point 232H. The fiber splicing point 232H is connected to the polarization-maintaining fiber 214H on one side and a different type of fiber 234H on the other side. The different fiber 234H may be a single mode fiber, gradient-index fiber or thermally expanded core fiber.

Figure 2I:
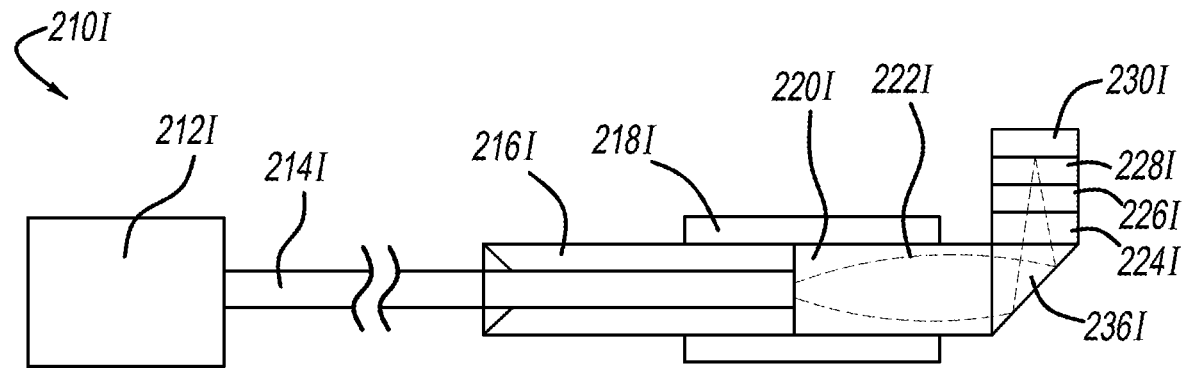
Figure 2J:
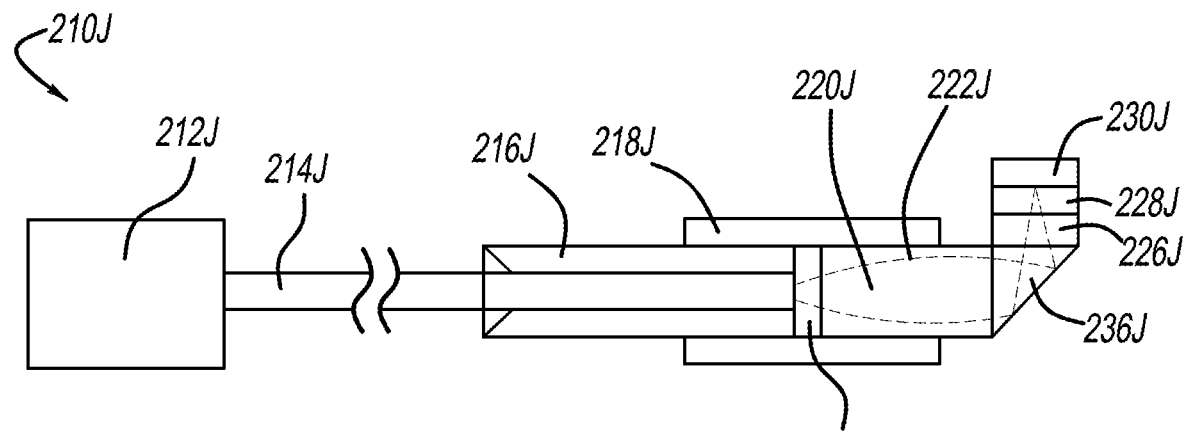
Figure 2K:
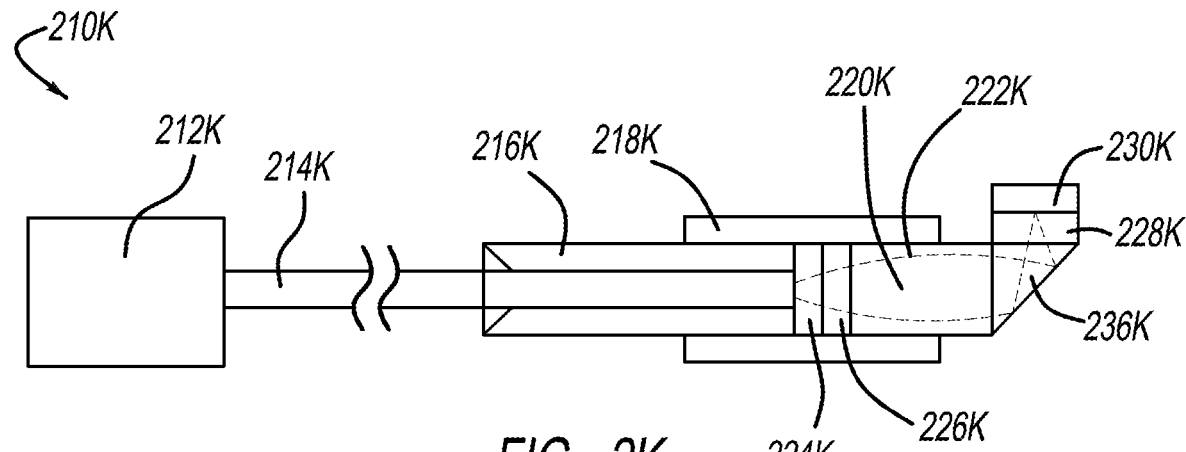

Referring to FIGS. 2I, 2J, and 2K, the sensors 210I, 210J, and 210K are similar to those sensors 210A, 210B, and 210C shown and described in FIGS. 2A, 2B, and 2C, respectively. However, the sensors 210I, 210J, and 210K each additionally disclose the use of a right angle prism 236I, 236J, and 236K being directly coupled to lens 220I, 220J, and 220K, respectively. By so doing, the right angle prisms 236I, 236J, and 236K have the advantage of allowing the tip of the sensors 210I, 210J, and 210K to be bent at a 90-degree angle, potentially allowing access to a measurement area and/or a magnetic-field polarization vector that may be inaccessible otherwise.

Figure 2L:
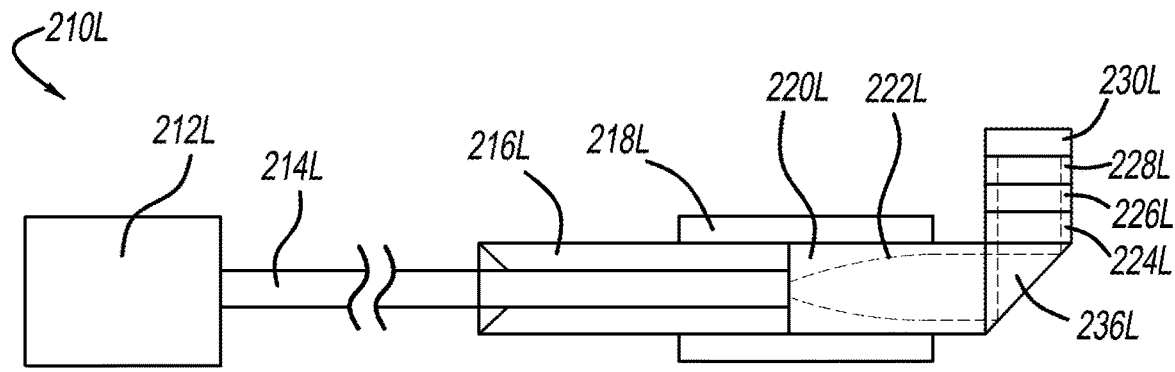
Figure 2M:
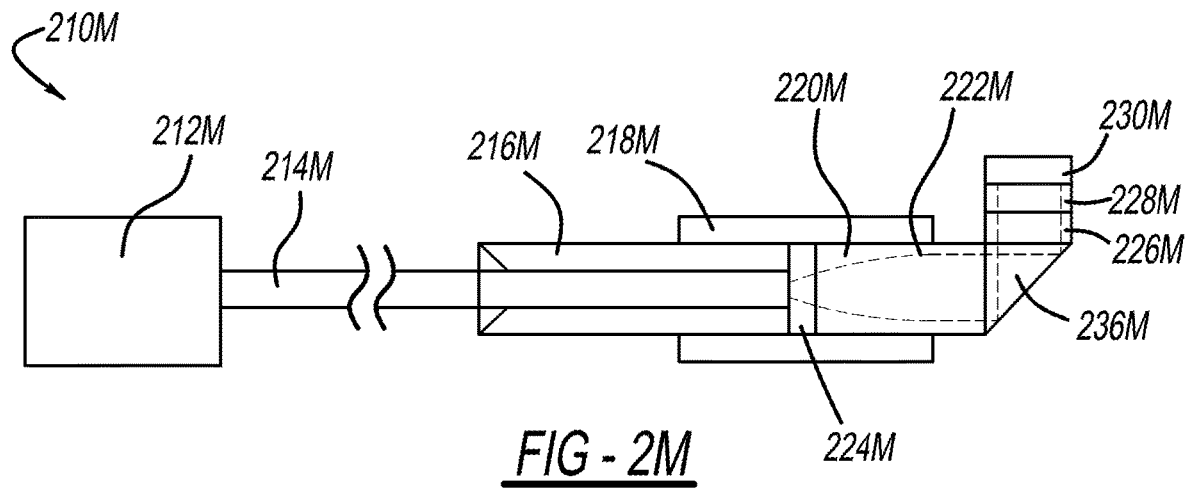
Figure 2N:
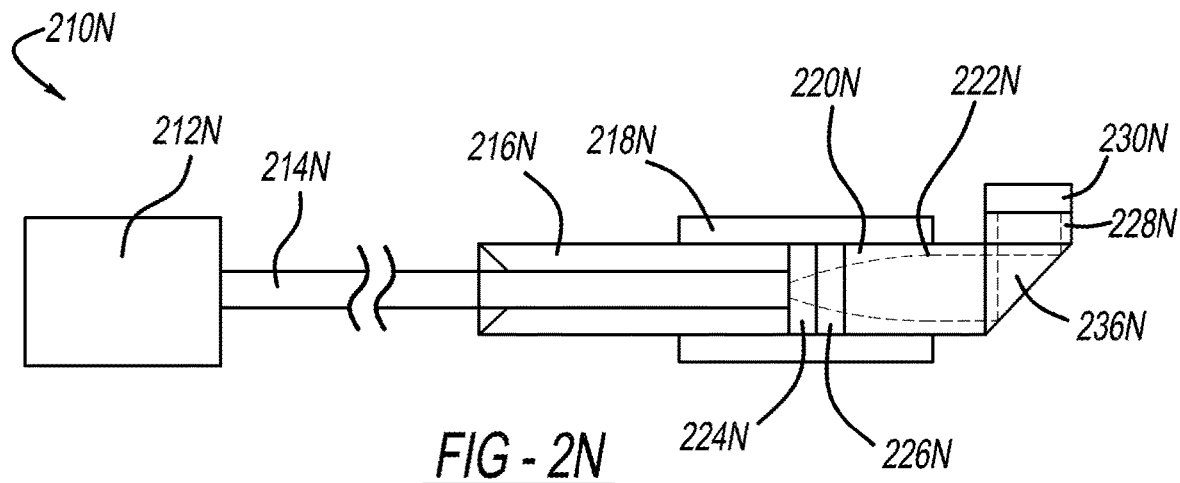

Referring to FIGS. 2L, 2M, and 2N, the sensors 210L, 210M, and 210N are similar to those shown and described in FIGS. 2I, 2J, and 2K, respectively. However, the sensors 210L, 210M, and 210N differ from those described above in that the focusing lenses 220I, 220J, and 220K, have been replaced with the collimating lenses 220L, 220M, and 220N, respectively.

Figure 3A:
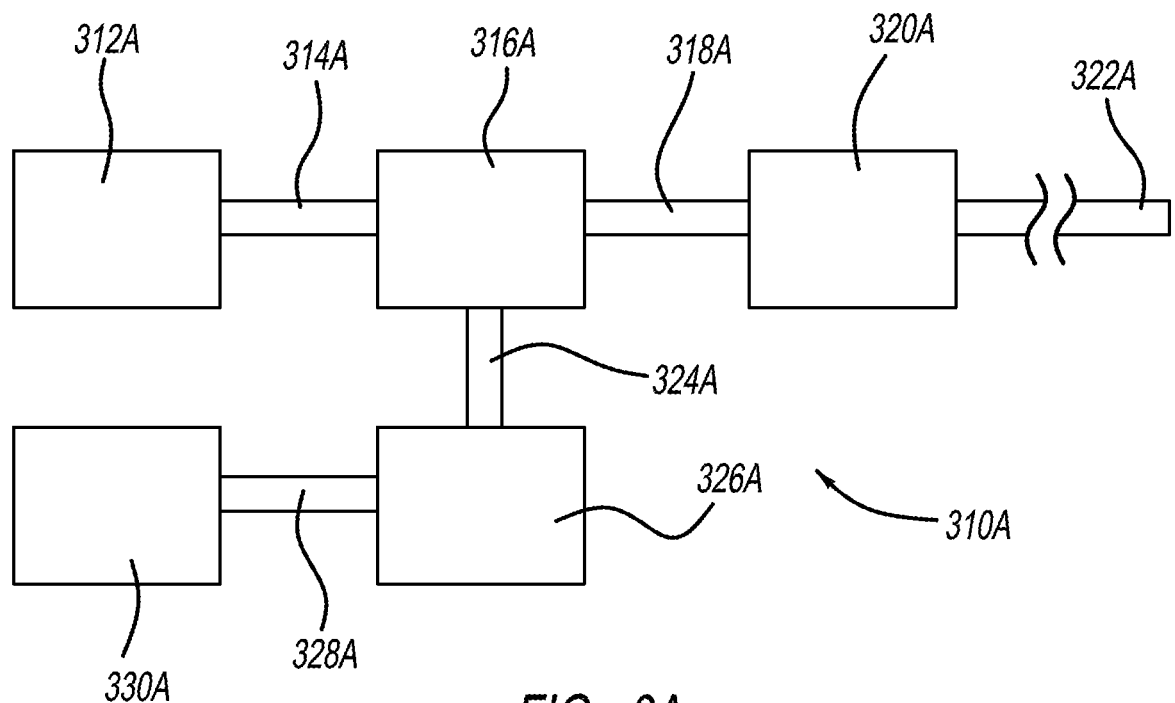
FIGS. 3A-3H illustrate block diagrams of optical mainframes for use with the optical fiber-mounted electric field sensors of FIGS. 1A-1N and/or the optical fiber-mounted magnetic field sensors of FIGS. 2A-2N.

Referring to FIG. 3A, an optical mainframe 310A is shown. The optical mainframe 310A functions to generate optical beams and send them to and receive them from the sensors described in FIGS. 1A-1N and FIGS. 2A-2N. The optical mainframe 310A also processes the optical signals received from the sensors so that they can be interpreted. The optical mainframe 310A includes a laser source 312A. The laser source may be a continuous wave laser source such as a distributed-feedback laser diode or a continuous-wave fiber laser, or it may be a pulse modulated laser source such as a mode-locked solid-state (e.g., titanium-doped sapphire) or fiber (e.g., rare-earth-doped silica-glass fiber) laser. The laser source provides a continuous or pulsed laser beam to a hybrid circulator 316A via a polarization-maintaining fiber 314A.

The hybrid circulator 316A functions to allow the optical beam provided by the laser source to be sent to the sensors, but also to allow any optical beam received from the sensors to be directed away from the laser source and to a photodetector, as will be explained later. Ports 1 and 2 of the hybrid circulator 316A are connected with polarization-maintaining optical fiber, and Port 3 is connected with conventional single-mode optical fiber. The hybrid circulator 316A has a polarization-maintaining path from its Port 1 input to its Port 2 output, with the polarization parallel to the fast axis of the PM fibers connecting Ports 1 and 2 being blocked within the circulator, while the circulator has a non-polarization-maintaining path between its Port 2 input to its Port 3 output, with the polarization parallel to the fast axis of the PM fiber 318A connecting Port 2 not blocked within the hybrid circulator. Hence the complete intensity of the optical beam returning from the probe and entering the hybrid circulator 316A via Port 2 is passed through to the photodetector. Optical beams provided to the sensors are sent to a fiber connector 320A via polarization-maintaining fiber 318A. From there, the sensors may be connected via polarization-maintaining fiber 322A. Optical beams that are returned from the sensors are transmitted from the sensors through polarization-maintaining fibers 322A and 318A to the hybrid circulator 316A. The hybrid circulator 316A then redirects these beams to a photodiode 326A via a fiber 324A. In this situation, the fiber 324A may be a single mode fiber. The photodiode 326A converts the received optical beams to electrical signals that are provided to a read out instrument 330A via an electrical cable 328A.

Figure 3B:
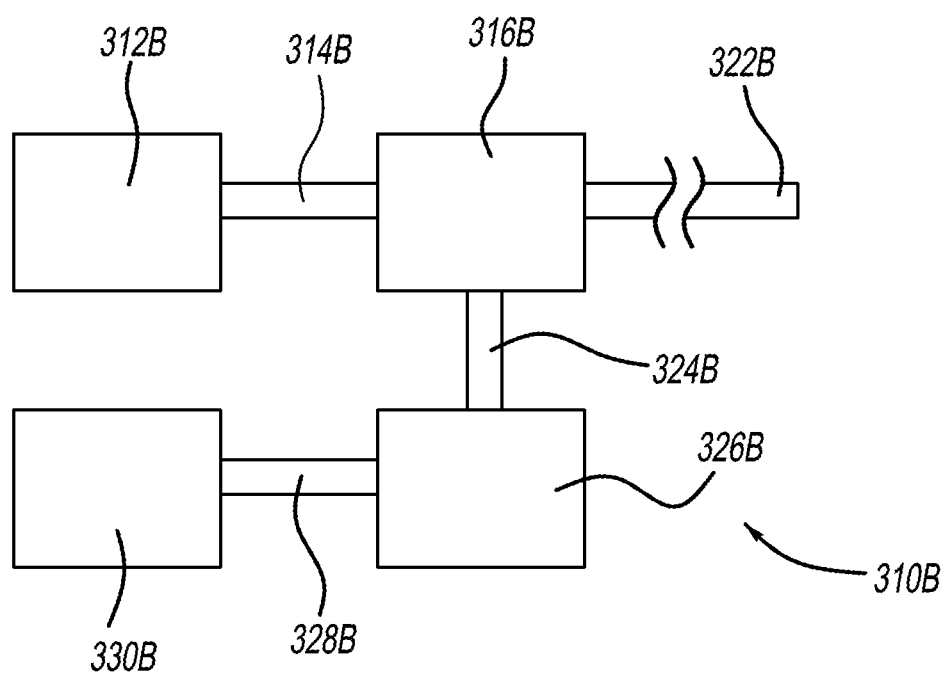

Referring to FIG. 3B, the optical mainframe 310B is similar to that shown above with regards to mainframe 310A. However, the optical mainframe 310B does not contain the fiber connector 320A. Here, the sensor is directly connected or spliced to the polarization-maintaining fiber 322B. As to the other components, the description applied above with regards to the optical mainframe 310A is applicable.

Figure 3C:
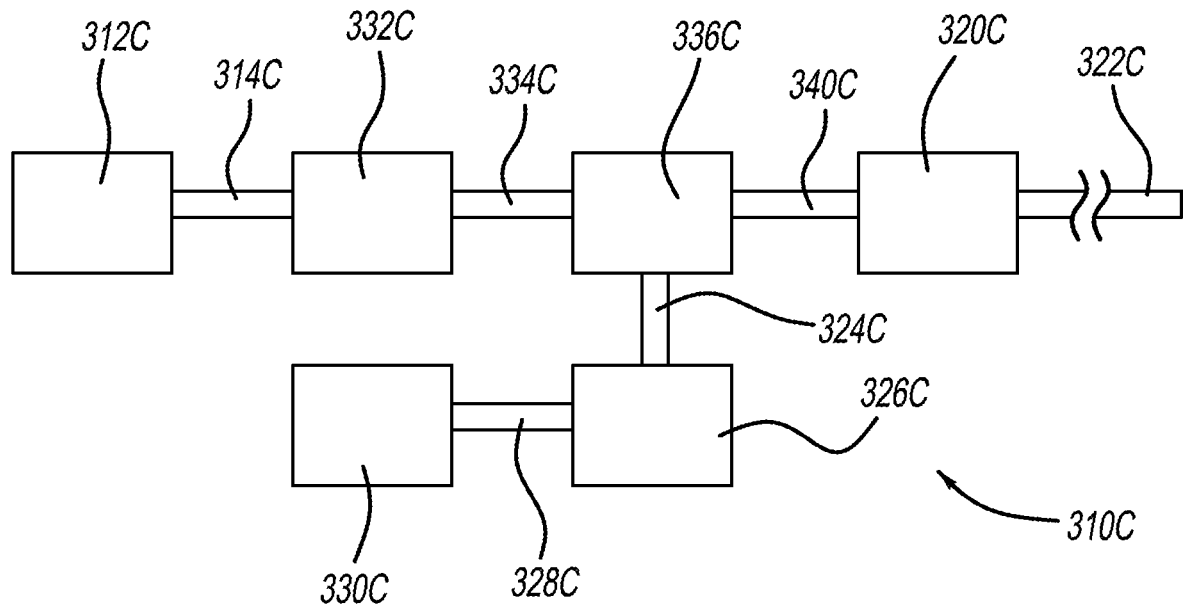

Referring to FIG. 3C, the optical mainframe 310C includes a laser source 312C connected to a polarization controller 332C via a polarization-maintaining fiber 314C. Polarized optical beams from the polarization controller 332C are provided to a non-polarization maintaining circulator 336C via a single mode fiber 334C. The non-polarization-maintaining circulator 336C is interconnected via conventional single-mode optical fiber on all three of its ports, and the internal pathways between Ports 1 and 2 and between Ports 2 and 3 do not block any polarizations of light beams. These optical beams are provided to a fiber connector 320C via a single mode fiber 340C. From there, a polarization-maintaining fiber 322C may be connected to the sensors described in FIGS. 1A-1N and FIGS. 2A-2N.

Optical beams received back from the sensor are provided to the non-polarization maintaining circulator 336C via the single mode fiber 340C. The non-polarization maintaining circulator 336C functions to send these received optical beams to a photodiode 326C via a single mode fiber 324C. An electrical cable 328C takes the electrical signals generated by the photodiode 326C based on the received optical beams and provides them to a readout instrument 330C.

Figure 3D:
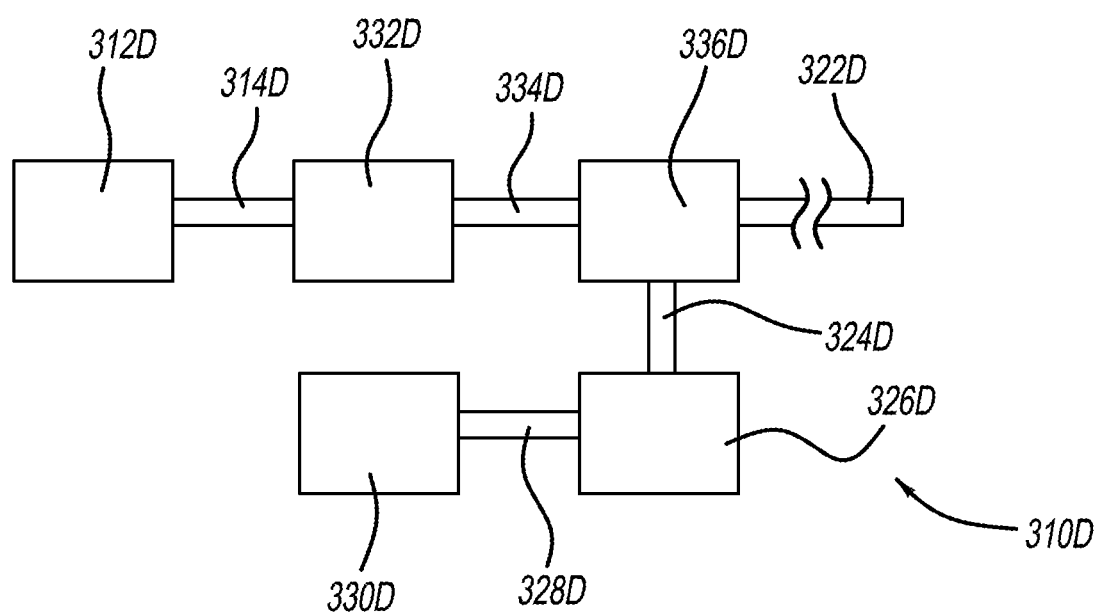

Referring to FIG. 3D, the optical mainframe 310D is similar to that described above in FIG. 3C, but this mainframe 310D does not include a fiber connector 320C. Here, the sensor is directly connected or spliced to the fiber 322D in an unperturbed fashion.

Figure 3E:
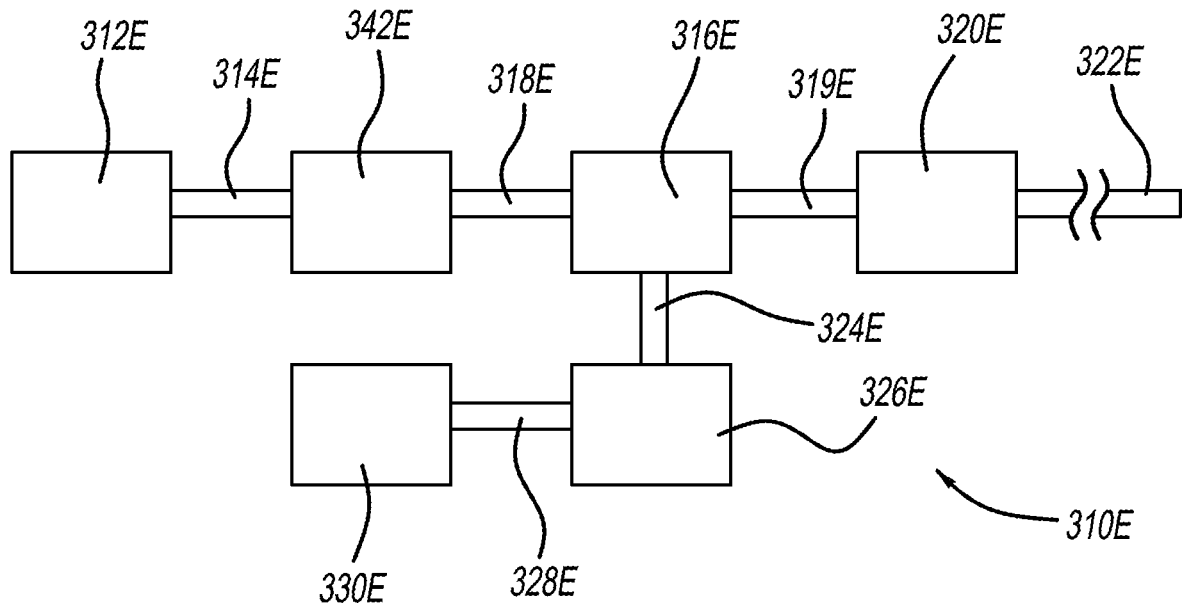

Referring to FIG. 3E, the optical mainframe 310E includes a laser source 312E that is connected to an optical modulator 342E via a polarization-maintaining fiber 314E. The optical modulator 342E functions to modulate the intensity of the optical beam at a local oscillator frequency that is separated from the signal frequency of the electric or magnetic field to be sensed by an intermediate frequency that falls within the radio-frequency spectrum. The optical modulator 342E provides the intensity-modulated optical beam to a hybrid circulator 316E via a polarization-maintaining fiber 318E. From there, the beam is provided to a fiber connector 320E via a polarization-maintaining fiber 319E. The fiber connector 320E allows the sensors described in FIGS. 1A-1N and FIGS. 2A-2N to be readily connected or disconnected from the optical mainframe 310E. The signal frequency of the electric or magnetic field to be measured mixes with the intensity-modulated local-oscillator optical beam within the electro-optic or magneto-optic material of the sensors, yielding an additional intensity modulation on the optical beam at an intermediate frequency.

Optical beams returning from the sensors are provided to the hybrid circulator 316E via the polarization-maintaining fiber 319E. These beams are then provided to a photodiode 326E via a single mode fiber 324E. The photodiode 326E functions to convert the optical beams into electrical signals at the radio-spectrum intermediate frequency, and these electrical signals are then provided to a read out instrument 330E via electrical cable 328E.

Figure 3F:
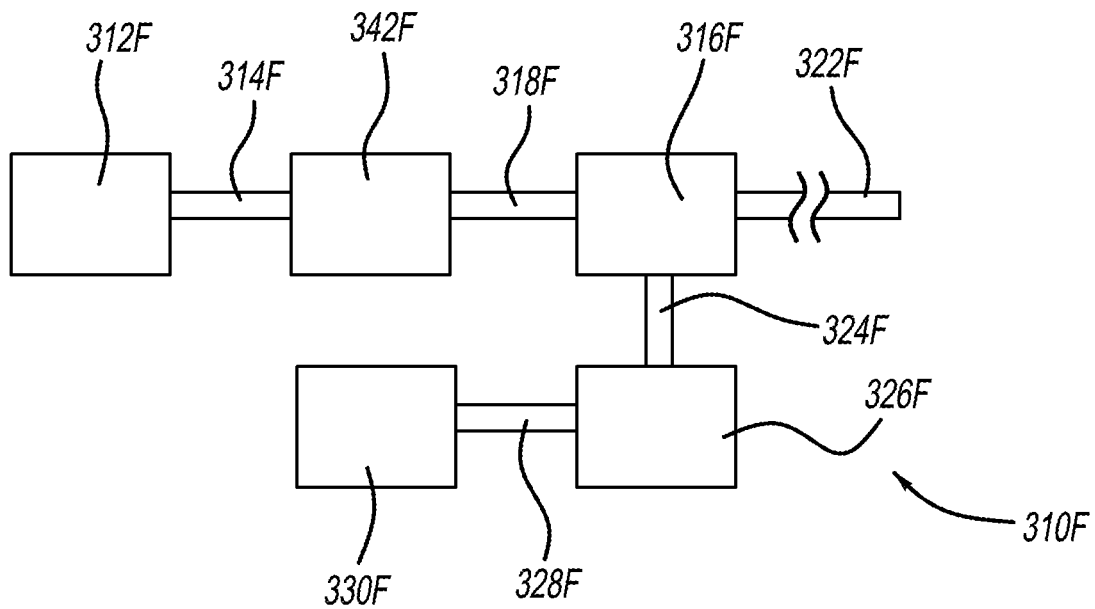

Referring to FIG. 3F, the optical mainframe 310F is similar to that described above in FIG. 3E. However, in this embodiment, the fiber connector 320E has been removed which allows the sensors to be directly connected or spliced to the optical mainframe 310F via polarization-maintaining fiber 322F.

Figure 3G:
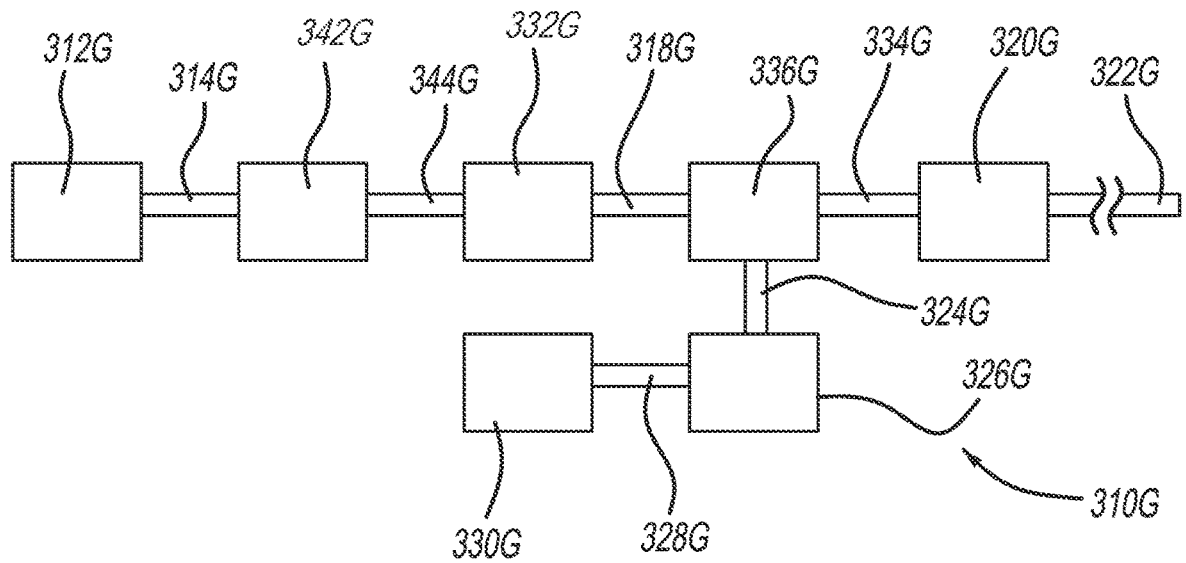

Referring to FIG. 3G, an optical mainframe 310G is shown. Here, the optical mainframe 310G includes a laser source 312G providing an optical beam to an optical modulator 342G via a polarization-maintaining fiber 314G. The optical modulator 342G functions to modulate the intensity of the optical beam at a local oscillator frequency that is separated from the signal frequency of the electric or magnetic field to be sensed by an intermediate frequency that falls within the radio-frequency spectrum. The optical beam emanating from the optical modulator 342G is provided to a polarization controller 332G via a single mode fiber 344G. The intensity-modulated optical beam is provided to a non-polarization-maintaining circulator 336G via a single mode fiber 318G. From there, the optical beam is provided to a fiber connector 320G through single mode fiber 334G so as to allow connection to the sensors described in FIGS. 1A-1N and FIGS. 2A-2N through their interconnecting fibers 322G. The signal frequency of the electric or magnetic field to be measured mixes with the intensity-modulated local-oscillator optical beam within the electro-optic or magneto-optic material of the sensors, yielding an additional intensity modulation on the optical beam at an intermediate frequency.

The optical beam returning from the sensor is provided to the non-polarization-maintaining circulator 336G, which then directs this returning beam into a photodiode 326G via non-polarization maintaining fiber 324G. The photodiode 326G functions to convert the optical beams into electrical signals at the radio-spectrum intermediate frequency, and these electrical signals are then provided to a read out instrument 330G via an electrical cable 328G.

Figure 3H:
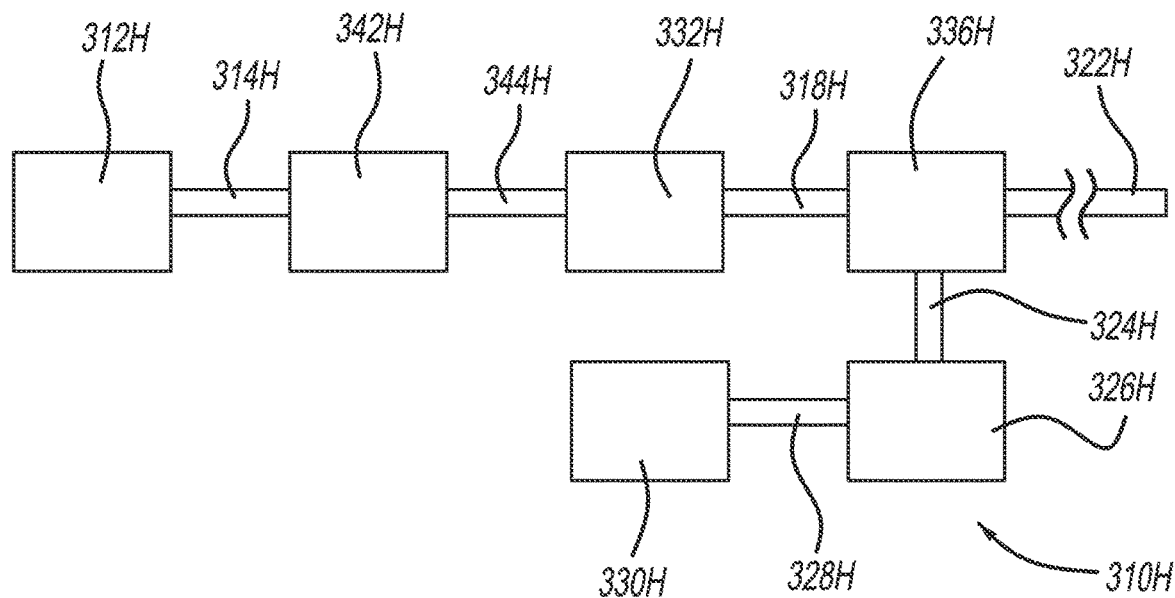

Referring to FIG. 3H, the optical mainframe 310H is similar to that described above in FIG. 3G. However, the optical mainframe 310H does not include the fiber connector 320G. As such, the sensors must be connected or spliced to the optical mainframe 310H directly via a single mode optical fiber 322H.

Figure 4A:
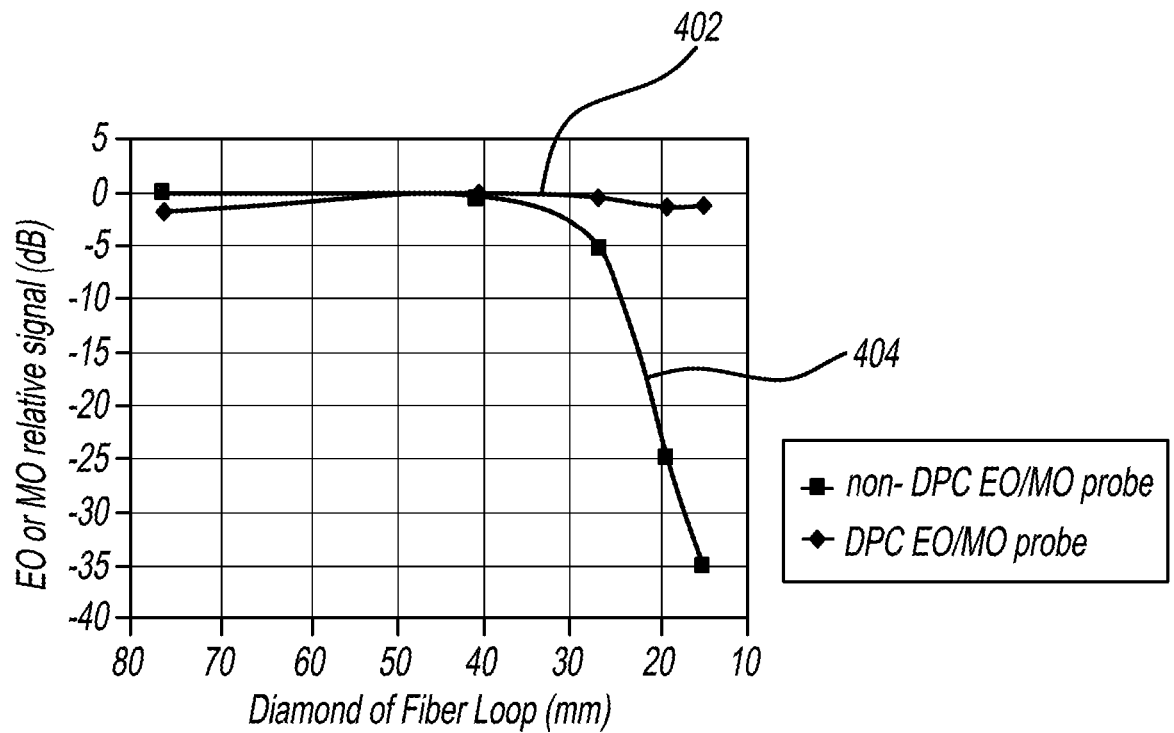
Figure 4B:
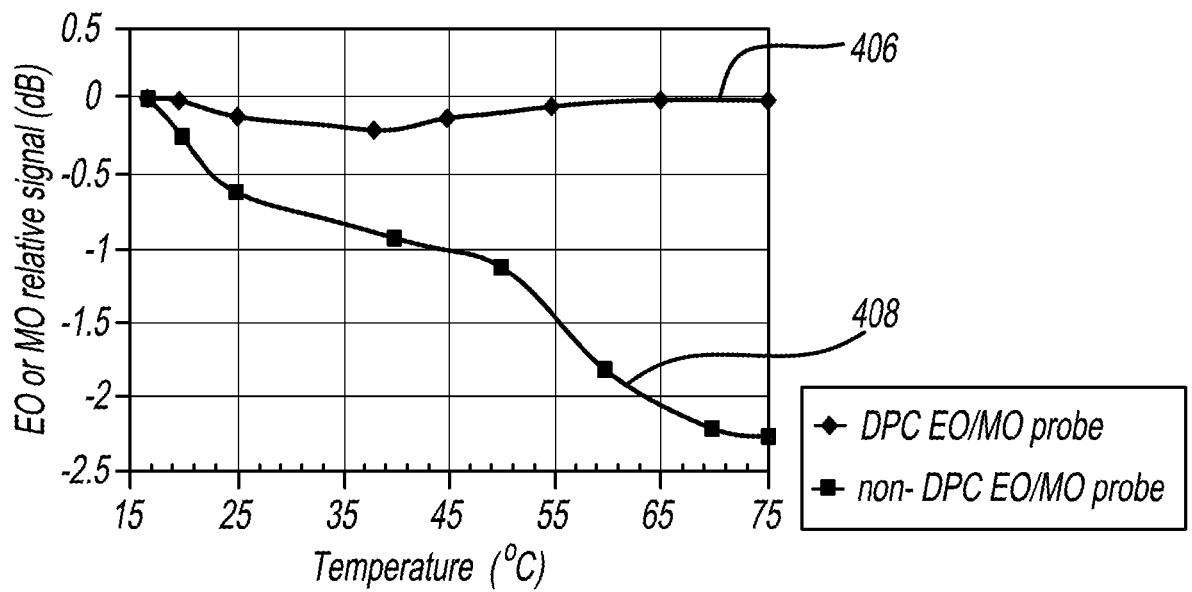
FIG. 4B illustrates the relative signal from the optical fiber-mounted field sensor of FIGS. 1A-1N and 2A-2N.

As stated above, the optical fiber-mounted field sensors as described in FIGS. 1A-1N and 2A-2N have the distinct advantage of allowing for nonintrusive, interference-free, reliable measurements with minimized noise. Referring to FIGS. 4A and 4B, a comparison of the optical fiber-mounted field sensors as described in FIGS. 1A-1N and 2A-2N to a more traditional field sensor is shown.

Referring to FIG. 4A, line 402 shows the relative signal from the optical fiber-mounted field sensor as described in FIGS. 1A-1N and 2A-2N as it relates to the diameter of the interconnecting fiber when a section of it is formed into a loop. Line 404 shows a previous art optical fiber-mounted field sensor's relative signal as it relates to the diameter of the interconnecting fiber when a section of it is formed into a loop. As one can see from this graph, the optical fiber-mounted field sensor as described in FIGS. 1A-1N and 2A-2N can maintain a much steadier relative signal.

Referring to FIG. 4B, line 406 shows the relative signal from the optical fiber-mounted field sensor as described in FIGS. 1A-1N and 2A-2N as it relates to the temperature of the sensor's interconnecting optical fiber. Line 408 shows a previous art optical fiber-mounted field sensor's relative signal as it relates to the temperature of the sensor's interconnecting optical fiber. As one can see from this graph, the optical fiber-mounted field sensor as described in FIGS. 1A-1N and 2A-2N can maintain a much steadier relative signal.

As a person skilled in the art will readily appreciate, the above description is meant as an illustration of an implementation of the principles of this invention. This description is not intended to limit the scope or application of this invention in that the invention is susceptible to modification, variation, and change, without departing from the spirit of this invention, as defined in the following claims.

The invention claimed is:

1. An optical fiber-mounted field sensor for measuring an electric or magnetic field, the sensor comprising:
    an optical fiber configured to receive light from a laser source, wherein the optical fiber is a polarization-maintaining optical fiber;
    a polarizer adjacent to an output of the optical fiber;
    a polarization manipulator adjacent to the polarizer and opposite of the optical fiber;
    electro-optical material or magneto-optical material adjacent to the polarization manipulator and opposite of the polarizer;
    a high reflection coating adjacent to the electro-optical material or magneto-optical material and opposite the polarization manipulator; and
    wherein the polarizer, polarization manipulator, electro-optical material or magneto-optical material, and high reflection coating are sequentially disposed and form a unitary structure.

2. The optical fiber-mounted field sensor of claim 1 further comprising a fiber guiding ferrule configured to guide the output of the fiber to the polarizer.

3. The optical fiber-mounted field sensor of claim 2 further comprising:
    a lens located between the output of the fiber and the electro-optical material or magneto-optical material; and
    an alignment sleeve connected to the fiber guiding ferrule and the lens configured to aligning the output of the fiber to the lens.

4. The optical fiber-mounted field sensor of claim 3, wherein at least one of the polarizer and polarization manipulator are located between the lens and the output of the fiber.

5. The optical fiber-mounted field sensor of claim 3, wherein at least one of the polarizer and polarization manipulator are located between the lens and the magneto-optical material or electro-optical material.

6. The optical fiber-mounted field sensor of claim 3, wherein the lens is either a focusing lens or a collimating lens.

7. The system of claim 3, further comprising a right angle prism located between the lens and the magnetic optical material or electro-optical material.

8. The system of claim 3, further comprising a right angle prism located between the lens and the output of the fiber.

9. The optical fiber-mounted field sensor of claim 8, wherein at least one of the polarizer and polarization manipulator are located between the lens and the output of the fiber.

10. The optical fiber-mounted field sensor of claim 8, wherein at least one of the polarizer and polarization manipulator are located between the right angle prism and the magnetic optical material or electro-optical material.

* * * * *